(12) United States Patent
Tokiwa

(10) Patent No.: US 11,225,059 B2
(45) Date of Patent: Jan. 18, 2022

(54) GLASS PLATE MODULE

(71) Applicant: NIPPON SHEET GLASS COMPANY, LIMITED, Tokyo (JP)

(72) Inventor: Junichi Tokiwa, Tokyo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/744,290

(22) PCT Filed: Jul. 12, 2016

(86) PCT No.: PCT/JP2016/070621
§ 371 (c)(1),
(2) Date: Feb. 20, 2018

(87) PCT Pub. No.: WO2017/010493
PCT Pub. Date: Jan. 19, 2017

(65) Prior Publication Data
US 2018/0200997 A1    Jul. 19, 2018

(30) Foreign Application Priority Data
Jul. 14, 2015   (JP) .............................. JP2015-140378

(51) Int. Cl.
*H05K 1/18*    (2006.01)
*H05K 1/03*    (2006.01)
(Continued)

(52) U.S. Cl.
CPC ...... *B32B 17/10385* (2013.01); *B23K 1/0008* (2013.01); *B32B 17/1055* (2013.01);
(Continued)

(58) Field of Classification Search
CPC .......... B32B 17/10385; B32B 17/1055; H01R 4/025; H01R 12/57; H01R 4/02; H05B 3/86; B23K 1/0008; H05K 1/18
See application file for complete search history.

(56) References Cited

U.S. PATENT DOCUMENTS

| 9,572,200 B2* | 2/2017 | Rateiczak ................ H05B 3/84 |
| 2005/0112291 A1* | 5/2005 | Okajima .............. B23K 1/0008 |
| | | 427/447 |

(Continued)

FOREIGN PATENT DOCUMENTS

| DE | 202013006781 U1 | 8/2013 |
| DE | 202014010271 U1 | 3/2015 |

(Continued)

OTHER PUBLICATIONS

International Search Report (PCT/ISA/210) issued in PCT/JP2016/070621, dated Sep. 20, 2016.

(Continued)

*Primary Examiner* — Ishwarbhai B Patel
(74) *Attorney, Agent, or Firm* — Birch, Stewart, Kolasch & Birch, LLP

(57) ABSTRACT

A glass plate module according to the present invention includes a glass plate, an electrically conductive layer laminated on the glass plate, at least one connection terminal fixed to the electrically conductive layer and made of an electrically conductive material, and lead-free solder for fixing the connection terminal to the electrically conductive layer. The connection terminal includes an installation portion that is fixed to the electrically conductive layer via the lead-free solder, a standing portion that extends from an end portion of the installation portion in a direction away from the glass plate, and a connection portion that is coupled to an end portion of the standing portion on the opposite side (Continued)

to the installation portion and extends in a direction away from the installation portion along a surface direction of the glass plate.

5 Claims, 11 Drawing Sheets

(51) Int. Cl.
| | |
|---|---|
| *H05K 1/11* | (2006.01) |
| *B32B 17/10* | (2006.01) |
| *H01R 4/02* | (2006.01) |
| *H05B 3/84* | (2006.01) |
| *B23K 1/00* | (2006.01) |
| *H01R 12/57* | (2011.01) |
| *H05B 3/86* | (2006.01) |

(52) U.S. Cl.
CPC ............... *H01R 4/02* (2013.01); *H01R 4/025* (2013.01); *H01R 12/57* (2013.01); *H05B 3/84* (2013.01); *H05B 3/86* (2013.01); *H05K 1/0306* (2013.01); *H05K 1/11* (2013.01); *H05K 1/18* (2013.01); *H05B 2203/016* (2013.01)

(56) References Cited

U.S. PATENT DOCUMENTS

| | | | | |
|---|---|---|---|---|
| 2007/0224842 | A1* | 9/2007 | Hoepfner | H01R 4/02 439/34 |
| 2009/0233119 | A1* | 9/2009 | Lyon | B32B 17/10 428/598 |
| 2012/0222893 | A1* | 9/2012 | Hwang | B23K 35/24 174/257 |
| 2012/0305311 | A1* | 12/2012 | Jenrich | H01R 4/023 174/75 R |
| 2013/0043066 | A1 | 2/2013 | Cholewa et al. | |
| 2014/0170913 | A1* | 6/2014 | Degen | H05B 3/84 439/887 |
| 2014/0182932 | A1* | 7/2014 | Cholewa | H05K 3/4015 174/84 R |
| 2015/0264800 | A1 | 9/2015 | Schmalbuch et al. | |
| 2016/0240935 | A1* | 8/2016 | Katakura | H01Q 1/1271 |
| 2016/0270159 | A1 | 9/2016 | Rateiczak et al. | |

FOREIGN PATENT DOCUMENTS

| | | |
|---|---|---|
| EP | 3327866 A1 | 5/2018 |
| JP | 62-160465 U | 10/1987 |
| JP | 3-3260 A | 1/1991 |
| JP | 6-5127 U | 1/1994 |
| JP | 2009-530783 A | 8/2009 |
| JP | 2010-123693 A | 6/2010 |
| JP | 2014-519149 A | 8/2014 |
| JP | 2015-69893 A | 4/2015 |

OTHER PUBLICATIONS

Extended European Search Report, dated Mar. 6, 2019, for counterpart European Application No. 16824473.9.
Japanese Office Action, dated Feb. 12, 2019, for counterpart Japanese Application No. 2015-140378, with an English translation.
Chinese Office Action and Search Report for counterpart Chinese Application No. 201680040995.1, dated Dec. 24, 2018, with English translation.
Chinese Office Action for counterpart Chinese Application No. 201680040995.1, dated Aug. 5, 2019, with English translation.
Japanese Decision of Rejection and English translation, dated Sep. 10, 2019, for Japanese Patent Application No. 2015-140378.
European Communication pursuant to Article 94(3) EPC for European Application No. 16824473.9, dated Nov. 26, 2020.

* cited by examiner

GLASS PLATE MODULE

TECHNICAL FIELD

The present invention relates to a glass plate module that is mounted to a window frame of a structure.

BACKGROUND ART

For example, Patent Literature 1 discloses a connection terminal that is connected to an electrically conductive layer of a glass plate of an automobile. A cable or the like is connected to such a connection terminal, and electric power is supplied to the electrically conductive layer via the connection terminal.

CITATION LIST

Patent Literature

Patent Literature 1: JP 2014-519149T

SUMMARY OF INVENTION

Technical Problem

Incidentally, a connection terminal such as that described above is fixed to an electrically conductive layer via lead-free solder. However, since lead-free solder is hard when compared with lead-containing solder, there is a risk that if the connection terminal catches on something, or the cable connected to the connection terminal is suddenly pulled, the lead-free solder or the glass plate will crack.

The present invention was made in order to address the foregoing problem, and it is an object thereof to provide a glass plate module that can prevent the electrically conductive layer and the glass plate from cracking even when an external force is exerted on the connection terminal.

Solution to Problem

A glass plate module according to the present invention includes a glass plate, an electrically conductive layer laminated on the glass plate, at least one connection terminal fixed to the electrically conductive layer and made of an electrically conductive material, and lead-free solder for fixing the connection terminal to the electrically conductive layer, wherein the connection terminal includes an installation portion that is fixed to the electrically conductive layer via the lead-free solder, a standing portion that extends from an end portion of the installation portion in a direction away from the glass plate, and a connection portion that is coupled to an end portion of the standing portion on the opposite side to the installation portion and extends in a direction away from the installation portion along a surface direction of the glass plate, the connection portion has a power supply portion to which a cable for supplying electric power to the electrically conductive layer is connected, the power supply portion being located at a position that is spaced apart from the installation portion in the surface direction of the glass plate, and the lead-free solder has a shape such that the nearer to the electrically conductive layer from a surface of the standing portion on the connection portion side, the further the lead-free solder extends to the power supply portion side.

With this configuration, since the connection terminal has the standing portion provided between the installation portion and the connection portion, when the lead-free solder is melted by heating the connection terminal, the lead-free solder can be prevented from moving to the connection portion. Therefore, when the lead-free solder has solidified and thereby fixed the installation portion and the electrically conductive layer to each other, the connection portion and the electrically conductive layer are not directly connected to each other via the lead-free solder. In addition, the connection portion extends in the direction away from the installation portion along the surface direction of the glass plate. Therefore, for example, when an upward force is exerted on an end portion of the connection portion, due to the moment of rotation of this force, stress concentrates on the coupling portion between the installation portion and the standing portion, or the standing portion above the coupling portion. As a result, concentration of stress on an end portion of a portion of the lead-free solder that is in contact with the electrically conductive layer can be prevented, and the electrically conductive layer and the glass plate can be prevented from cracking at this portion. In particular, according to the present invention, the lead-free solder has a shape such that the nearer to the electrically conductive layer from the surface of the standing portion on the connection portion side, the further the lead-free solder extends to the power supply portion side, and the end portion of the lead-free solder that is in contact with the electrically conductive layer is located at a position that is shifted to the power supply portion side relative to the surface of the standing portion on the connection portion side. Thus, concentration of stress on this end portion can be further prevented.

Consequently, when an external force is exerted on the connection portion of the connection terminal, for example, even if a worker or a working tool comes into contact therewith, or the cable is unintentionally pulled, the electrically conductive layer and the glass plate can be prevented from cracking as described above, or the connection terminal can be prevented from becoming detached from the electrically conductive layer.

Note that with regard to the wording "along the surface direction of the glass plate" as used in the description of the configuration of the connection portion according to the present invention, the connection portion does not have to be parallel to the glass plate. It is sufficient that the connection portion generally extends along the surface direction of the glass plate, and at least it is sufficient that the connection portion is not perpendicular to the glass plate. In addition, although the lead-free solder extends "from the surface of the standing portion on the connection portion side", the surface on the connection portion side also contains a surface of the coupling portion between the standing portion and the installation portion. Furthermore, the cable encompasses a thin wire such as a conductor.

In the above-described glass plate module, it is possible that a length of the standing portion between a surface of the installation portion that faces the electrically conductive layer and a surface of the connection portion that faces the electrically conductive layer is 2 mm or more.

With this configuration, the lead-free solder that is melted as described above is even less likely to move to the connection portion against gravity, and thus, the occurrence of cracking such as that described above can be even more reliably prevented.

In each of the above-described glass plate modules, it is possible that the standing portion stands at an angle of 80 degrees or more to the installation portion.

With this configuration, the lead-free solder that is melted as described above is even less likely to move to the connection portion against gravity, and thus, the occurrence of cracking such as that described above can be even more reliably prevented.

In each of the above-described glass plate modules, the power supply portion can include a holding portion that holds the cable, the holding portion being located on a surface of the connection portion that faces the electrically conductive layer.

With this configuration, even though the standing portion is provided, the cable is held on the electrically conductive layer side of the connection portion, and thus, the protruding height of the connection terminal from the glass plate can be suppressed. Accordingly, the connection terminal can be kept from coming into contact with the worker, the working tool, or the like.

In the above-described glass plate module, it is possible that the holding portion is configured to hold the cable by being crimped onto the cable.

Advantageous Effects of Invention

According to the glass plate module of the present invention, even when an external force is applied, the connection terminal can be prevented from becoming detached from a connecting material, and the connecting material can be prevented from being damaged.

DESCRIPTION OF EMBODIMENTS

Figure 1:
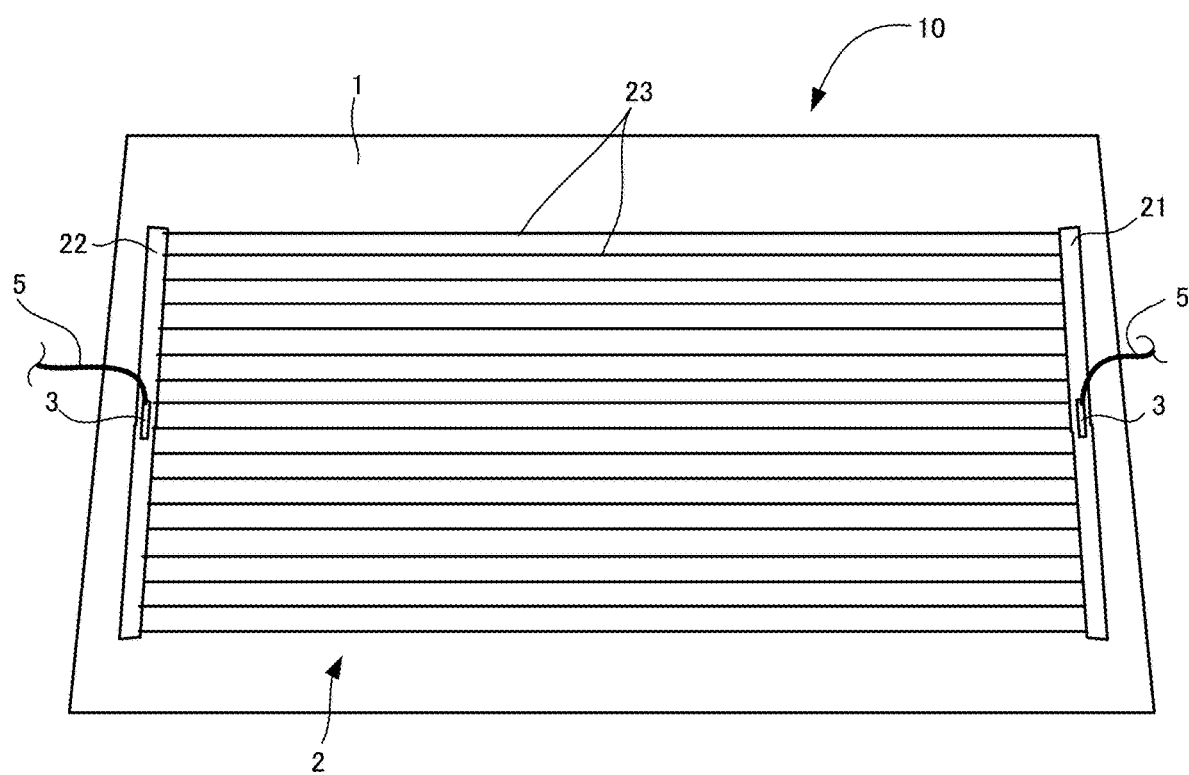
FIG. 1 is a plan view of a glass plate module according to an embodiment of the present invention.

An embodiment of a glass plate module according to the present invention will be described below with reference to the drawings. FIG. 1 is a plan view of this glass plate module. As shown in FIG. 1, this glass plate module is to be fitted in a window frame of an automobile. Specifically, this glass plate module 10 has a glass plate 1, a defogger 2 (an electrically conductive layer) laminated on this glass plate 1, and a pair of connection terminals 3 that are attached to this defogger 2 using lead-free solder 4. Cables 5 for supplying electric power are respectively attached to the connection terminals 3, the cables 5 extending from inside the automobile, and an electric current supplied from the cables 5 is supplied to the defogger via the connection terminals 3. The constituent members will be described below.

1. Glass Plate

A known automotive glass plate can be used as the glass plate 1. For example, heat absorbing glass, regular clear glass or green glass, or UV green glass may be used as the glass plate 1. However, the glass plate 1 as described above is required to attain visible light transmittance that conforms to the safety standards of the country in which the automobile is to be used. For example, an adjustment can be made such that solar absorptance, visible light transmittance, and the like satisfy the safety standards. An example of the composition of clear glass and an example of the composition of heat absorbing glass are shown below.

Clear Glass $SiO_2$: 70 to 73 mass %
$Al_2O_3$: 0.6 to 2.4 mass %
CaO: 7 to 12 mass %
MgO: 1.0 to 4.5 mass %
$R^2O$: 13 to 15 mass % (R is an alkali metal)
Total iron oxide (T-$Fe_2O_3$) in terms of $Fe_2O_3$: 0.08 to 0.14 mass %

Heat Absorbing Glass

With regard to the composition of heat absorbing glass, a composition obtained based on the composition of clear glass by setting the ratio of the total iron oxide (T-$Fe_2O_3$) in terms of $Fe_2O_3$ to 0.4 to 1.3 mass %, the ratio of $CeO_2$ to 0 to 2 mass %, and the ratio of $TiO_2$ to 0 to 0.5 mass % and reducing the components (mainly $SiO_2$ and $Al_2O_3$) forming the framework of glass by an amount corresponding to the increases in T-$Fe_2O_3$, $CeO_2$, and $TiO_2$ can be used, for example.

Note that the type of the glass plate 1 is not limited to clear glass or heat absorbing glass, and can be selected as appropriate according to the embodiment. For example, the glass plate 1 may be a resin window made of acrylic resin, polycarbonate resin, or the like.

In addition, the thickness of the glass plate 1 according to this embodiment does not have to be limited particularly. However, from the viewpoint of weight reduction, the thickness of the glass plate 1 may be set in a range of 2.2 to 5.1 mm, a range of 2.4 to 3.8 mm, and a range of 2.7 to 3.2 mm. Furthermore, the thickness of the glass plate 1 may be set to be 3.1 mm or smaller.

In addition, the glass plate 1 as described above may be laminated glass having an interlayer made of resin or the like sandwiched by a plurality of glass plates, instead of being a single glass plate.

2. Defogger

Next, the defogger 2 will be described. As shown in FIG. 1, the defogger 2 has a pair of a first busbar 21 and a second busbar 22 for supplying electric power, which extend in the up-down direction along two side edges of the glass plate 1. A plurality of horizontal elements 23 are arranged in parallel at a predetermined interval between the busbars 21 and 22.

In addition, an electric current is supplied from the connection terminal 3 that is attached to the first busbar 21, and the connection terminal that is attached to the second busbar 22 is grounded via the cable 5. Due to this configuration, when an electric current is supplied to the defogger 2, defogging heat is generated in the horizontal elements 23. Note that the busbars 21 and 22 and the horizontal elements 23 are formed by printing electroconductive silver paste onto the surface of the glass plate 1 and firing the silver paste, for example. However, the material of the defogger 2 is not limited to this silver paste, and can be selected as appropriate.

3. Connection Terminals

Figure 2:
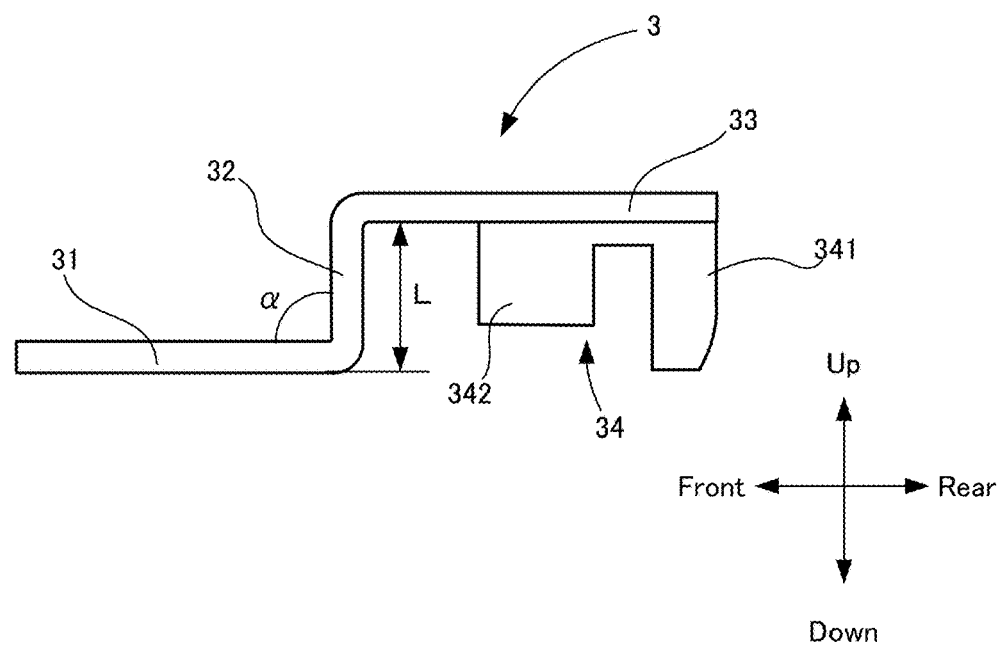
FIG. 2 is a side view of a connection terminal for use in the glass plate module in FIG. 1.
Figure 3:
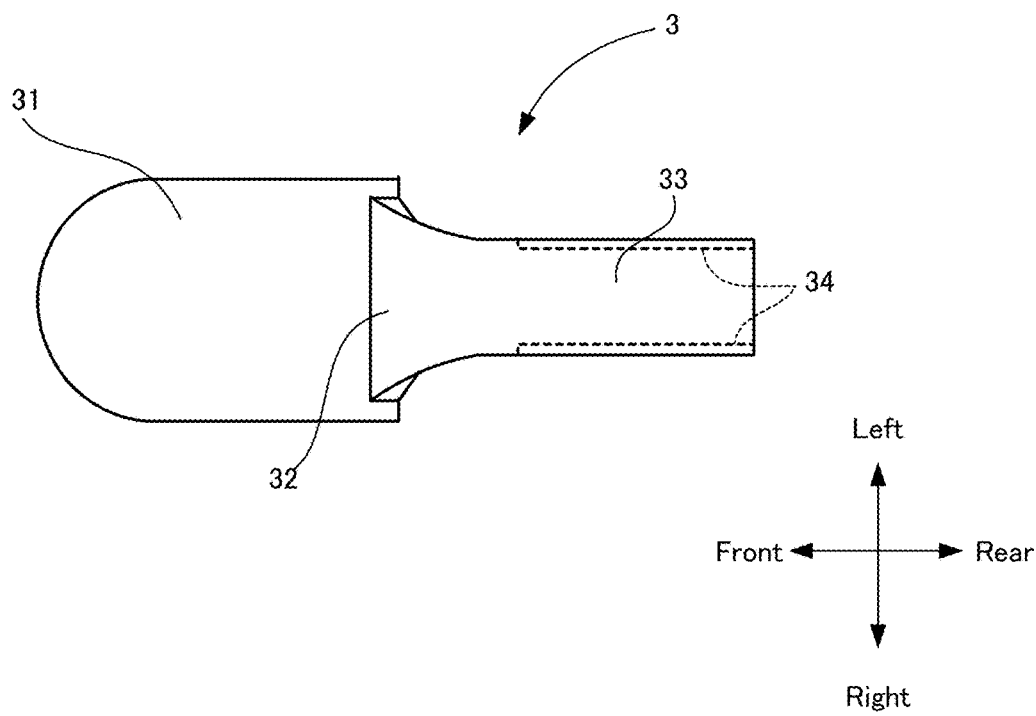
FIG. 3 is a plan view of the connection terminal in FIG. 2.

Next, the connection terminals will be described with reference to FIGS. 2 and 3. FIG. 2 is a side view of a connection terminal, and FIG. 3 is a plan view of the connection terminal. For convenience of description, description will be given below based on the directions shown in FIG. 2. Specifically, description will be given with the up-down direction in FIG. 2 being referred to as the up-down direction, the right-left direction in FIG. 2 being referred to as the front-rear direction, and the up-down direction in FIG. 3 being referred to as the right-left direction or the width direction.

As shown in FIGS. 2 and 3, each connection terminal 3 according to this embodiment is formed integrally by folding an electrically conductive material such as a metal plate, and includes a single, plate-shaped installation portion 31 that is installed on the busbar 21 or 22 of the defogger 2. The installation portion 31 is formed in a rectangular overall shape, but a front end side thereof is formed in a circular-arc shape. A lower surface of the installation portion 31 is fixed to the busbar 21 or 22 via the lead-free solder 4.

A plate-shaped standing portion 32 that extends upward is integrally coupled to a rear end portion of the installation portion 31. The standing portion 32 is formed in a rectangular shape, and stands at an angle of about 90 degrees to the installation portion 31. Note that although the angle α that the standing portion 32 forms with the installation portion 31 is not limited to a specific angle, the angle α is preferably 80 to 150 degrees and more preferably 80 to 120 degrees. Setting the angle α at not less than 80 degrees as described above can prevent the lead-free solder 4 from moving from the installation portion 31 to the connection portion 32 against gravity, as will be described later. On the other hand, setting the angle α at not more than 150 degrees can secure the ease of operation during heating of the lead-free solder 4 as will be described later.

In addition, a plate-shaped connection portion 33 that horizontally extends rearward is integrally coupled to an upper end portion of the standing portion 32. The connection portion 33 is formed in a rectangular shape in plan view, and a pair of holding portions 34 extending downward are integrally coupled to the right and left sides, respectively, of the connection portion 33. Here, the distance L from the lower surface of the installation portion 31 to a lower surface of the connection portion 33 in the normal direction with respect to the glass plate 1 is preferably 2 mm or more, more preferably 2.5 mm or more, and even more preferably 3 mm or more. The purpose of this is to prevent the lead-free solder 4 from moving from the installation portion 31 to the connection portion 32 against gravity, as will be described later, by setting the distance L at 2 mm or more.

Moreover, each holding portion 34 includes a first holding piece 341 that is disposed on a rear end side of the connection portion 33 and a second holding piece 342 that is shorter in downward length than the first holding piece 341 and is disposed on a front end side. In this manner, the two holding portions 34 are disposed on the connection portion 33 such that these holding portions 34 are nearer to the rear end side than the installation portion 31. In addition, the cable 5 is fixed to the holding portions 34 by disposing the cable 5 between the two holding portions 34 and crimping the two holding portions 34 onto the cable 5, as will be described later.

4. Solder

Next, the lead-free solder 4 that is applied to the installation portion 31 of the connection terminal 3 will be described. For example, the lead-free solder 4 whose Sn content is 90% or more is hard and may crack when joined to a laminated glass plate. Even in such a case, soft lead-free solder 4 such as indium solder and bismuth solder can be used for the joining.

5. Attachment of Connection Terminals

Figure 4:
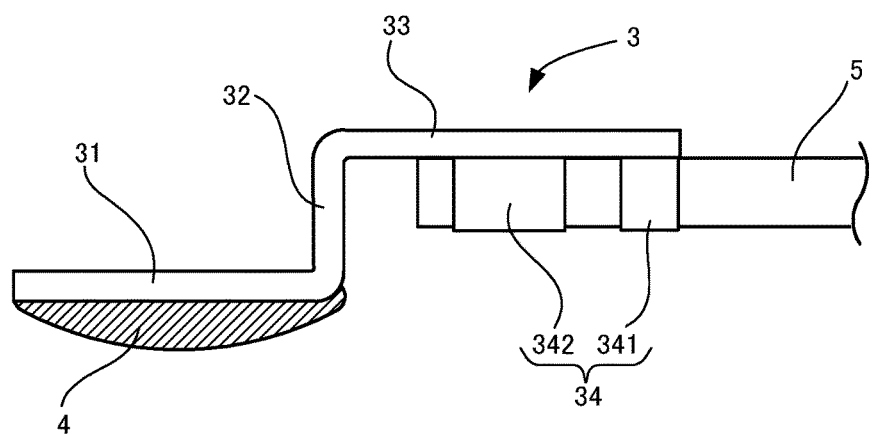
FIG. 4 is a side view illustrating a method for attaching the connection terminal shown in FIG. 2 to a glass plate.
Figure 5:
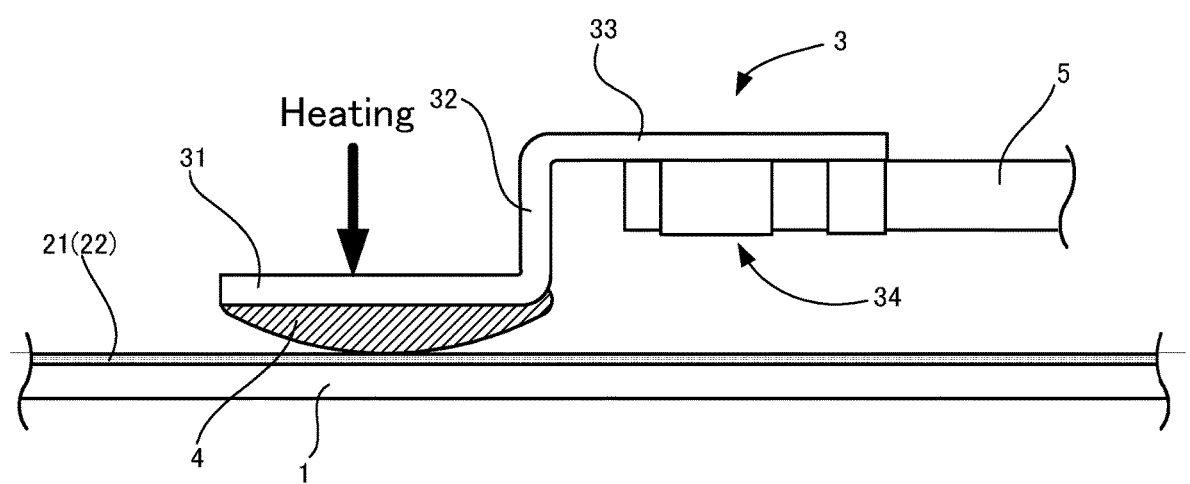
FIG. 5 is a side view illustrating the method for attaching the connection terminal shown in FIG. 2 to the glass plate.
Figure 6:
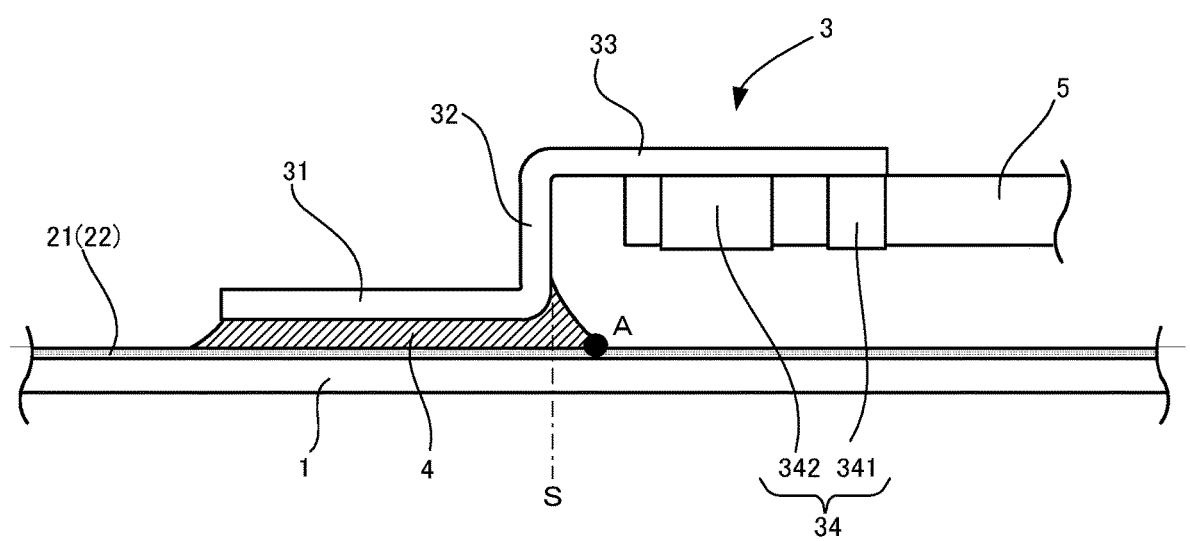
FIG. 6 is an enlarged side view of the glass plate module in FIG. 1.

Next, a method for attaching each connection terminal will be described with reference to FIGS. 4 to 6. First, as shown in FIG. 4, the cable 5 is disposed between the two holding portions 34, and the cable 5 is fixed to the lower surface side of the connection portion 33 by crimping the holding portions 34 onto the cable 5. Note that the cable 5 excluding its connection portion that is connected to the two holding portions 34 of the connection terminal 3 is coated with an electrically non-conductive member such as rubber. Subsequently, the lead-free solder 4 is applied to the lower surface of the installation portion 31. At this time, as will be described later, the amount of lead-free solder 4 that is applied is such that the lead-free solder 4 is squeezed out past the installation portion 31 when attached to the busbar 21 or 22.

Subsequently, the connection terminal 3 that has been prepared as described above is fixed to the busbar 21 or 22. First, as shown in FIG. 5, the lead-free solder 4 is placed on the busbar 21 or 22. Subsequently, the upper surface side of the installation portion 31 of the connection terminal 3 is heated. Thus, the heat is transmitted to the lead-free solder 4 via the installation portion 31, and the lead-free solder 4 is melted. As a result, as shown in FIG. 6, the lead-free solder 4 spreads out in the surface direction of the glass plate 1 while being squeezed out past the installation portion 31. Then, as the lead-free solder 4 solidifies, the installation portion 31 is fixed to the busbar 21 or 22. At this time, a portion of the lead-free solder 4 extends past a rear end S of the installation portion 31 toward the holding portions 34 and also has a shape that is flared toward the glass plate 1. That is to say, a rear end A of the lead-free solder 4 that is in contact with the busbar 21 or 22 is located rearward of the rear end S of the installation portion 31.

6. Characteristics

As described above, according to the glass plate module of this embodiment, the following effects can be acquired.

(1) The lead-free solder 4 has the property of moving to a higher-temperature portion. When the lead-free solder 4 is melted by heating the connection terminal 3, the temperature of the standing portion 32 and the connection portion 33 becomes higher than that of the glass plate 1. Thus, there is a possibility that the lead-free solder 4 will move toward the connection portion 33 against gravity. In this regard, since the connection terminal 3 of the above-described glass plate module 10 has the standing portion 32 between the installation portion 31 and the connection portion 33, the lead-free solder 4 can only move to the middle of the standing portion 32, and therefore can be prevented from reaching the connection portion 33. Thus, the following effects can be achieved.

Figure 7:
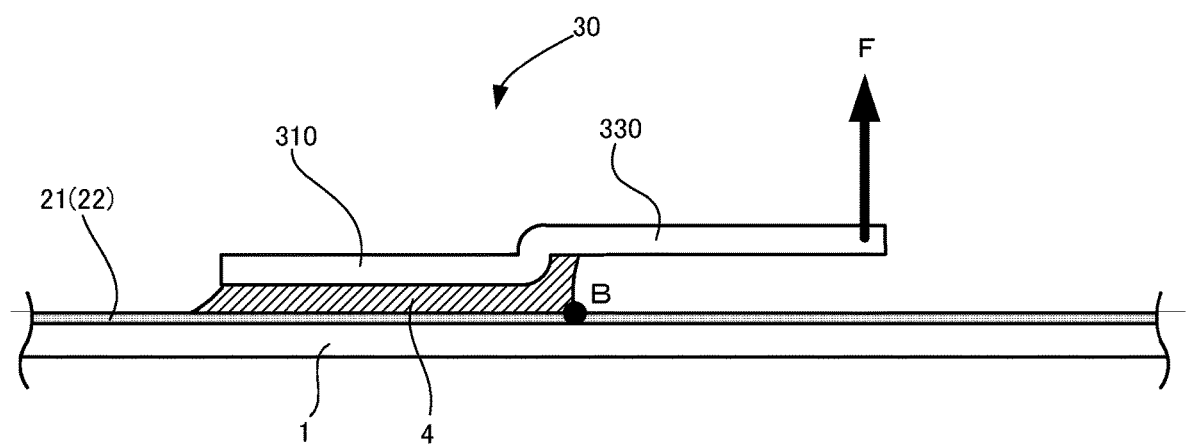
FIG. 7 is a diagram for describing a mechanism that works when a load is applied to a connection terminal according to a comparative example.
Figure 8:
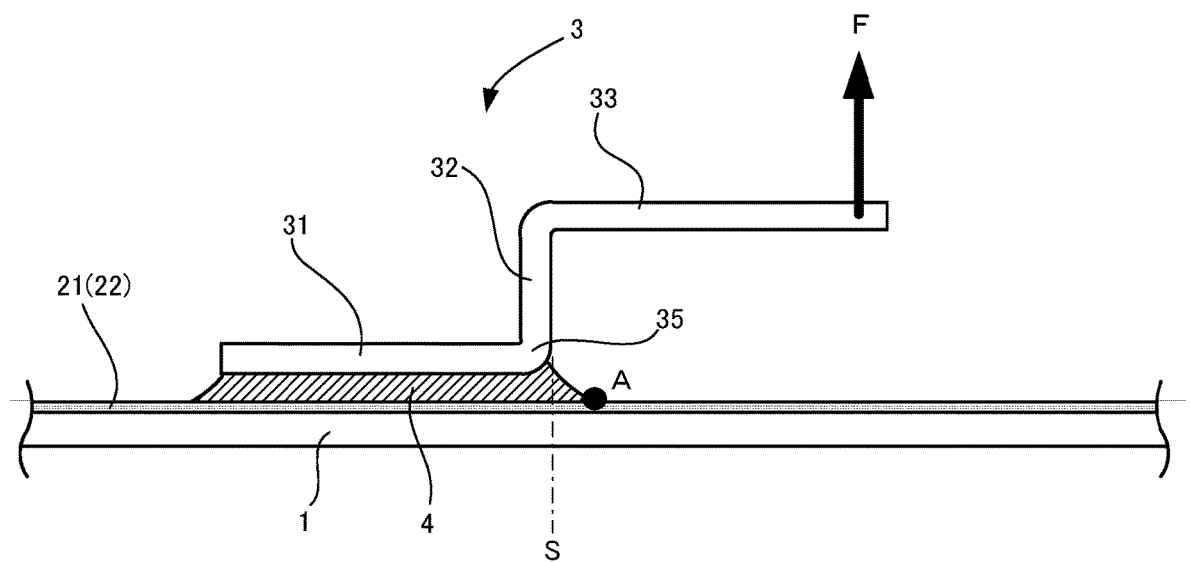
FIG. 8 is a diagram for describing a mechanism that works when a load is applied to the connection terminal according to FIG. 6.

For example, as shown in FIG. 7, if a connection terminal 30 without a standing portion is used, the lead-free solder 4 moves from an installation portion 310 to the lower surface of a connection portion 330. That is to say, the busbar 21 or 22 is connected to the connection portion 33 via the lead-free solder 4. Therefore, if an upward force F is exerted on a rear end portion of the connection portion 330 in this state, due to the moment of rotation of this force F, stress concentrates on a rear end B of the portion of the lead-free solder 4 that is in contact with the busbar 21 or 22. As a result, there is a risk that the busbar 21 or 22 or the glass plate 1 will crack at this portion B. In particular, the lead-free solder 4 is hard and is thus more likely to crack than lead-containing solder, for example.

In contrast, in the connection terminal 3 according to this embodiment, due to the standing portion 32 being provided between the installation portion 31 and the connection portion 33, the connection portion 33 is not directly coupled to the busbar 21 or 22 via the lead-free solder 4. Accordingly, when an upward force F is exerted on the rear end portion of the connection portion 33, stress concentrates on a coupling portion 35 between the installation portion 31 and the standing portion 32 due to the moment of rotation of the force F. As a result, concentration of stress on the rear end A of the portion of the lead-free solder 4 that is in contact with the busbar 21 or 22 is prevented, so that the busbar 21 or 22 and the glass plate 1 can be prevented from cracking at this portion A. In particular, in this embodiment, the rear end A of the portion of the lead-free solder 4 that is in contact with the busbar 21 or 22 is located rearward of the coupling portion 35 between the installation portion 31 and the standing portion 32, and thus concentration of stress on the rear end A can be further prevented.

Consequently, when an external force is exerted on the connection portion 33 of the connection terminal 3, for example, even if the worker or the working tool comes into contact therewith, or the cable 5 is unintentionally pulled, the busbars 21 and 22 and the glass plate 1 can be prevented from cracking as described above, and the connection terminal 3 can be prevented from becoming detached from the busbar 21 or 22.

In particular, in the above-described connection terminal, when the distance L from the lower surface of the installation portion 31 to the lower surface of the connection portion 33 in the normal direction with respect to the glass plate 1 is set to be 2 mm or more, the lead-free solder is even less likely to move to the connection portion 33 against gravity, and thus, the occurrence of cracking such as that as described above can be more reliably prevented. In addition, this effect can also be achieved by setting the angle of the standing portion 32 to the installation portion 31 to be 80 degrees or more.

(2) In the connection terminal 3 according to this embodiment, even though the standing portion 32 is provided, the protruding height of the connection terminal 3 from the glass plate 1 can be suppressed because the cable is held on the lower surface side of the connection portion 33 by the holding portions 34. Accordingly, the connection terminal 3 can be kept from coming into contact with the worker, the working tool, or the like. In addition, since the holding portions 34 do not protrude from the upper surface of the connection portion 33, the structure of the connection terminal 3 can be made more compact.

Figure 9:
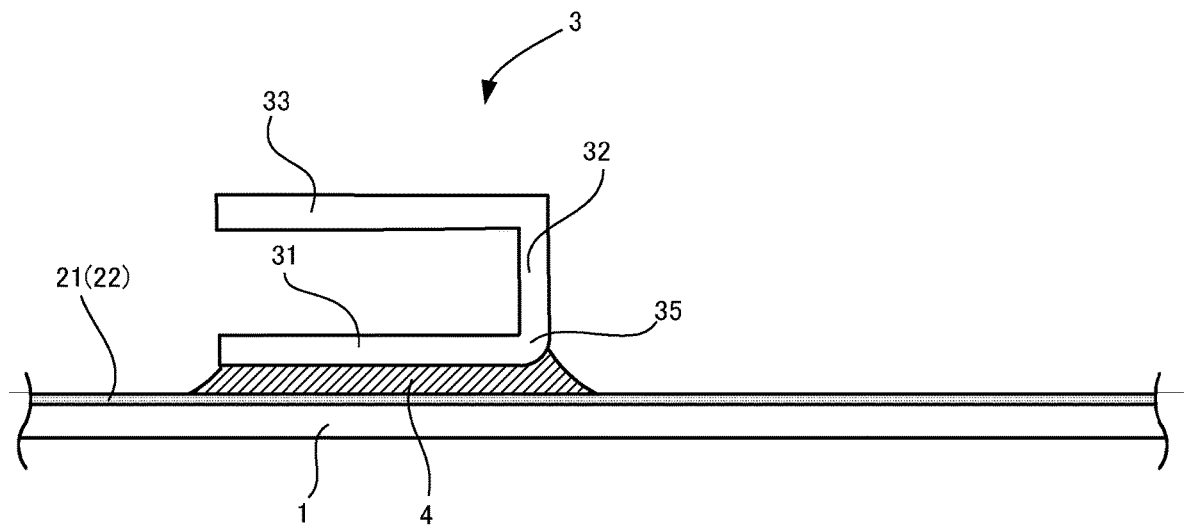
FIG. 9 is a reference diagram showing another example with a structure different from that of the present invention.

(3) The connection portion 33 extends in a direction away from the installation portion 31 along the surface direction of the glass plate 1, and does not have a structure, such as the one shown in FIG. 9, that covers an upper portion of the installation portion 31. Thus, when heating the installation portion 31 while melting the lead-free solder 4, it is possible to heat the installation portion 31 using a soldering iron or the like from above the installation portion 31, for example.

7. Variations

One embodiment of the present invention has been described above, but the present invention is not limited to the foregoing embodiment, and various modifications can be made without departing from the gist of the invention. In addition, a plurality of variations described as follows can be combined as appropriate.

Figure 10:
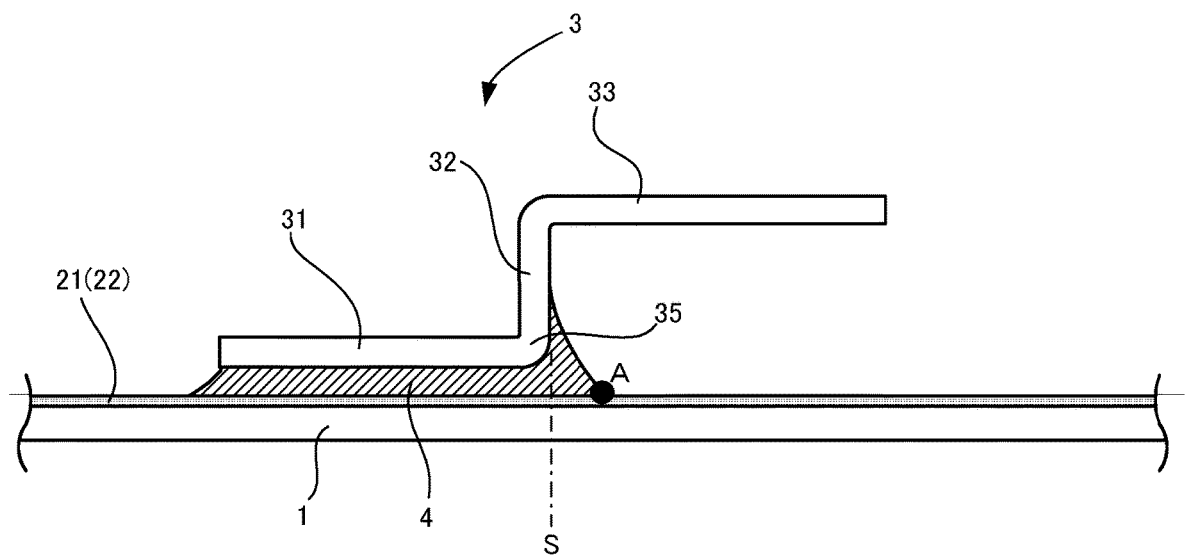
FIG. 10 is a side view showing another example of the glass plate module according to the present invention.

1. In the foregoing embodiment, when the distance L from the lower surface of the installation portion 31 to the lower surface of the connection portion 33 in the normal direction with respect to the glass plate 1 is long, or the angle of the standing portion 32 to the installation portion 31 is large, the busbars 21 and 22 can be prevented from cracking as described above; however, these configurations are not absolutely necessary, and it is sufficient that at least a configuration is adopted in which the standing portion 32 is provided, and the rear end A of the portion of the lead-free solder 4 that is in contact with the busbar 21 or 22 is located rearward of a surface of the standing portion 32 on the connection portion 33 side. For example, as shown in FIG. 10, it is sufficient that the lead-free solder 4 does not reach the connection portion 33, and the lead-free solder 4 may extend from the surface of the standing portion 32 on the connection portion 33 side toward the glass plate 1.

2. The shapes of the installation portion 31, the standing portion 32, and the connection portion 33 are not limited to specific shapes, and these portions can have various shapes. For example, the connection portion 33 does not have to be parallel to the glass plate 1, and may intersect with the glass plate 1 at an angle other than a perpendicular angle. In addition, for example, a configuration can also be adopted in which a plurality of protrusions are formed on the lower surface of the installation portion 31 to increase the area of contact with the lead-free solder 4. Furthermore, the connection portion 33 is not necessarily required to extend in the front-rear direction. Instead, a configuration may also be adopted in which the connection portion 33 extends in the right-left direction (width direction), and the cable 5 is connected thereto from the right or left direction.

3. In the foregoing embodiment, the connection portion 33 and the cable 5 are fixed to each other by crimping the holding portions 34 onto the cable 5; however, the present invention is not limited to this, and various connection methods can be applied. For example, it is possible to attach a connector to a leading end of the cable 5 and fit the connector in the connection portion 33 or to fix the cable 5 and the connection portion 33 to each other through soldering or using an electrically conductive adhesive, and these portions can be used as the power supply portion of the present invention. In addition, in the case where there is no limitation on the protruding length of the connection terminal 3 from the glass plate 1, the cable 5 can also be fixed to the upper surface side of the connection portion 33.

4. In the foregoing embodiment, an example was described in which the connection terminal 3 is fixed to the defogger 2, but apart from a defogger, any electrical component to which an electric current is supplied can applied as the electrically conductive layer of the present invention. For example, an antenna may be applied.

5. In the foregoing embodiment, an example was described in which a glass plate module is mounted to a window frame of an automobile, but the glass plate module according to the present invention can also be applied to a structure other than an automobile, such as a building.

6. Moreover, a configuration can also be adopted in which a flux is applied onto the electrically conductive layer, and the connection terminal 3 is fixed thereon via the lead-free solder 4. This configuration makes it possible to easily form a lead-free solder 4 with a flared shape. In this case, for example, Gammalux (manufactured by Senju Metal Industry Co., Ltd.) can be used as the flux.

EXAMPLE

An example of the present invention will be described below. However, the present invention is not limited to the following example.

1. Preparation of Example and Comparative Examples

Figure 11:
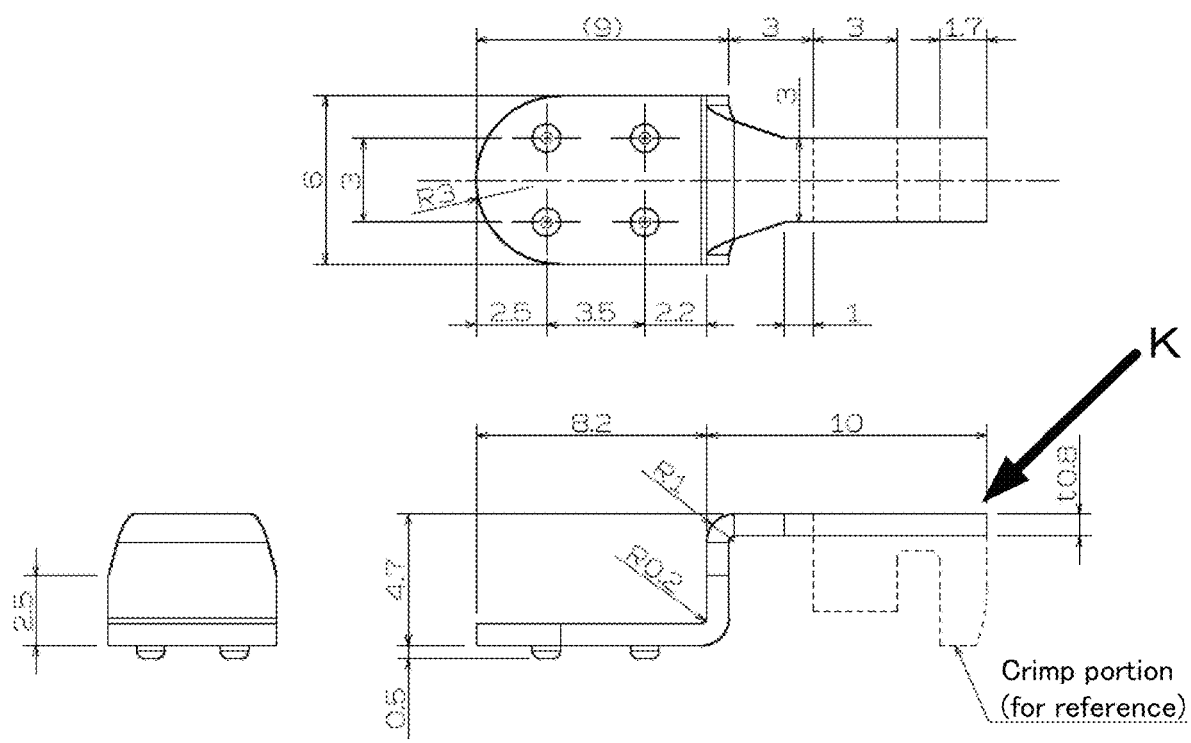
FIG. 11 shows diagrams according to an example.
Figure 12:
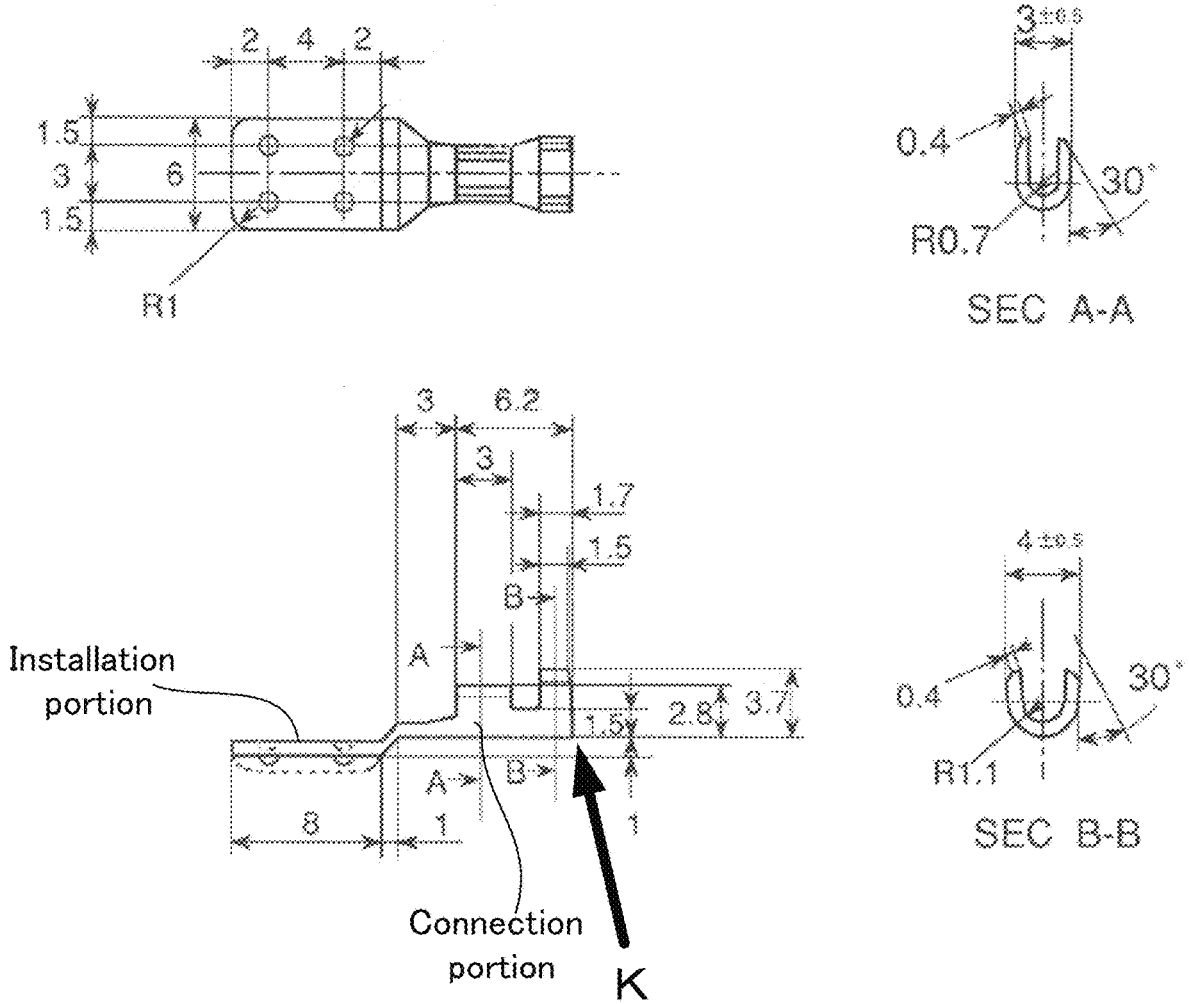
FIG. 12 shows diagrams according to Comparative Example 1.
Figure 13:
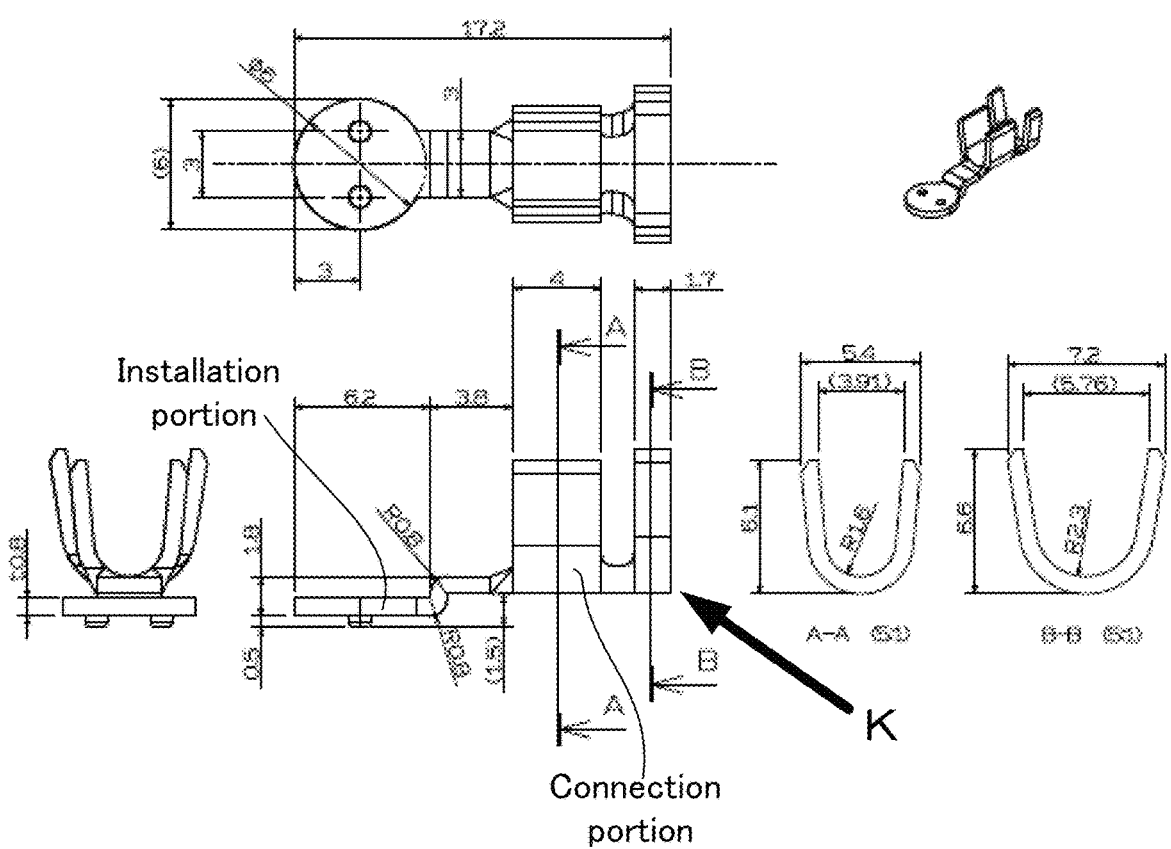
FIG. 13 shows diagrams according to Comparative Example 2.

A connection terminal having the same form as that of the above-described embodiment was produced as an example. Specifically, a connection terminal shown in FIG. 11 was produced. The material of the connection terminal was copper, and the dimensions of the connection terminal were as shown in FIG. 11 (the unit is mm). On the other hand, a connection terminal shown in FIG. 12 was produced as Comparative Example 1, and a connection terminal shown in FIG. 13 was produced as Comparative Example 2. The main difference from the example was that the connection terminals of the comparative examples were not provided with a standing portion.

Subsequently, the installation portions of the example and Comparative Examples 1 and 2 configured as described above were fixed onto an electrically conductive layer (whose material was Ag) laminated on a glass plate (air-quench tempered glass plate: the thickness 3.1 mm) using lead-free solder (Sn: 96.5% and Ag: 3.5%). Then, the example and Comparative Examples 1 and 2 were stored for 500 hours in a storage chamber at a temperature of 80° C. and 95% humidity.

2. Bond Strength Test

Next, six each of the connection terminals of the example and Comparative Examples 1 and 2 configured as described above were prepared, and a bond strength test was performed on them. Specifically, an upward force was exerted on portions indicated by arrows K in FIGS. 11 to 13, and the occurrence of cracking in the electrically conductive layer or the glass plate was checked. The upward force was gradually increased from 0 up to 78.4 N. The force (in N) at the time when the glass plate cracked was measured. Table 1 below shows the results.

TABLE 1

|  | 1 | 2 | 3 | 4 | 5 | 6 | Average |
|---|---|---|---|---|---|---|---|
| Ex. | — | — | — | — | — | — | — |
| Com. Ex. 1 | 30.1 | 25.0 | 27.5 | 25.7 | 54.6 | 46.9 | 35.0 |
| Com. Ex. 2 | 25.6 | 35.8 | 34.0 | 42.7 | 51.4 | 35.6 | 37.5 |

In Comparative Examples 1 and 2, with respect to all of the samples, the glass plate or the electrically conductive layer cracked prior to the exerted force reaching 78.4 N. On the other hand, in the example, neither the glass plate nor the electrically conductive layer cracked even when the exerted force reached 78.4 N.

Figure 14:
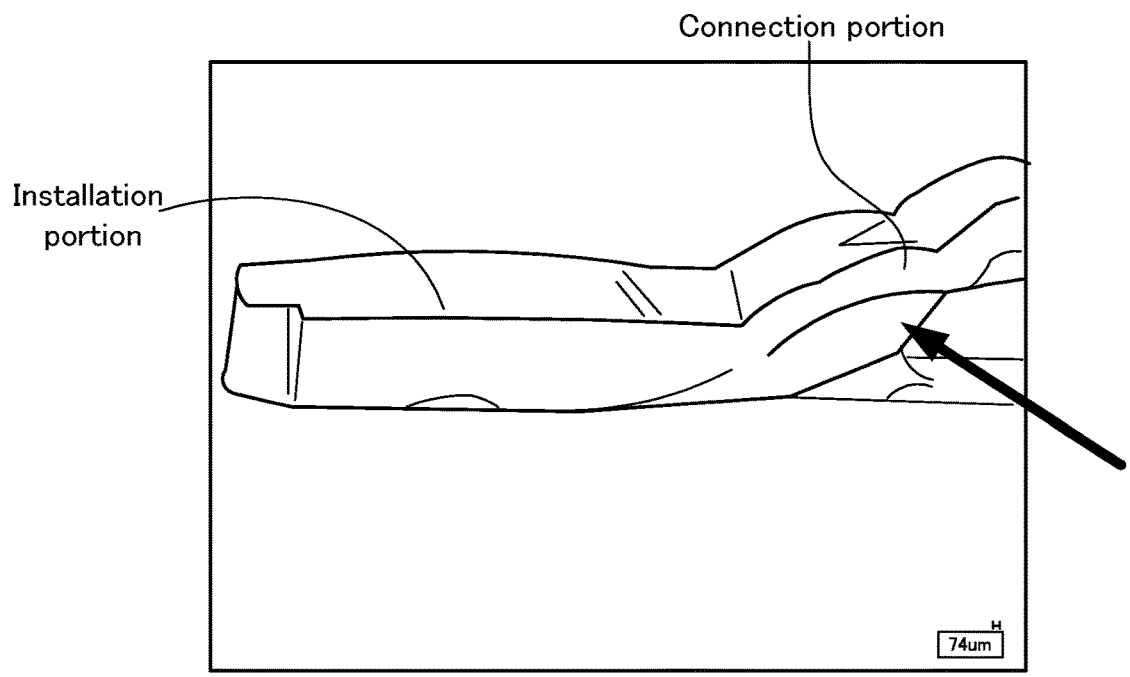
FIG. 14 is a photograph showing Comparative Example 1.
Figure 15:
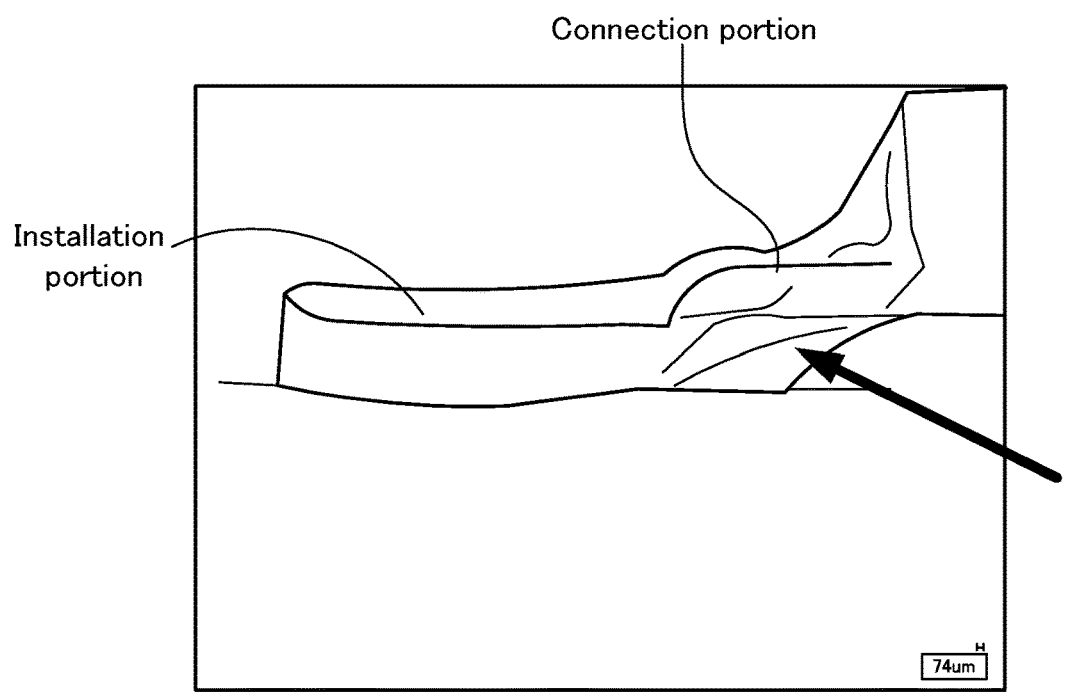
FIG. 15 is a photograph showing Comparative Example 2.
Figure 16:
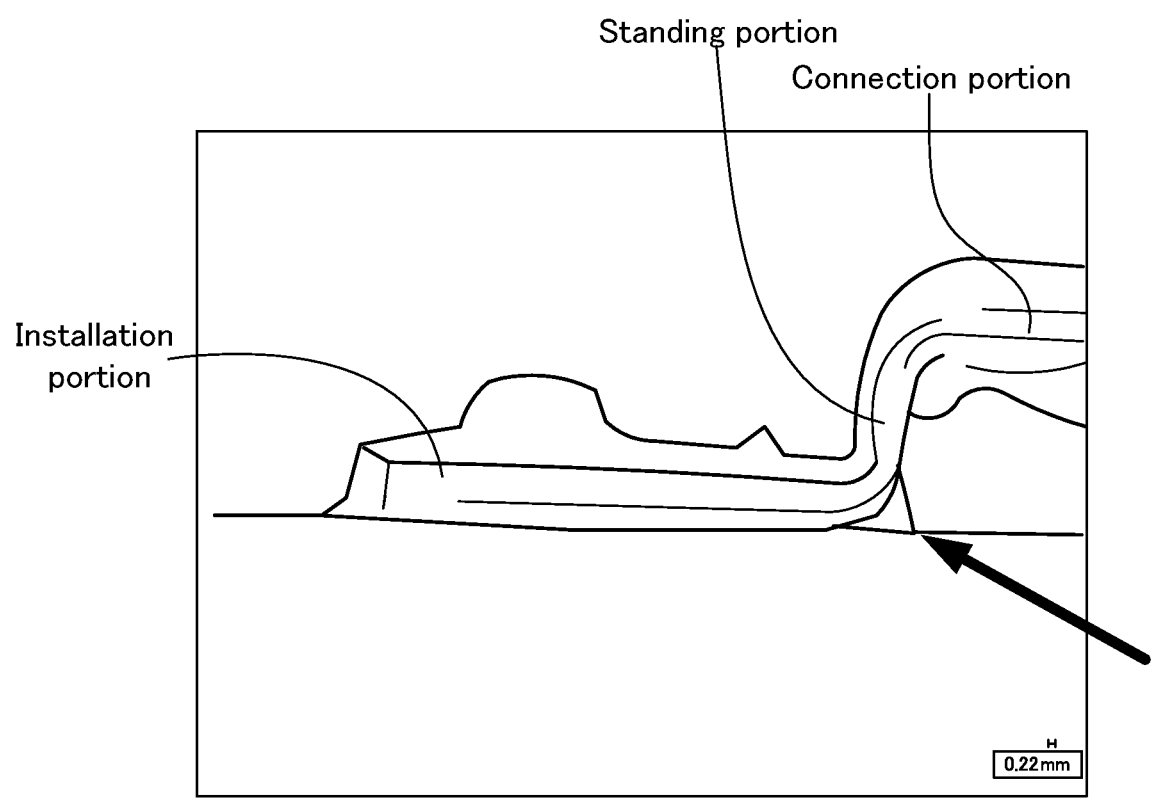
FIG. 16 is a photograph showing the example according to the present invention.

Here, photographs showing the examples and Comparative Examples 1 and 2 are examined. With respect to Comparative Example 1 shown in FIG. 14, the lead-free solder moved to a portion indicated by the arrow in FIG. 14, that is, the lower surface of the connection portion, and it can be found that the electrically conductive layer and the connection portion were connected to each other by the lead-free solder. Similarly, with respect to Comparative Example 2 shown in FIG. 15 as well, the lead-free solder moved to the lower surface of the connection portion indicated by the arrow in FIG. 15. On the other hand, with respect to the example shown in FIG. 16, the lead-free solder reached only the vicinity of a lower end portion of the standing portion, and the lead-free solder extended rearward from the rear end portion of the installation portion in a flared manner. Therefore, it can be considered that in Comparative Examples 1 and 2, the upward force even acted on the electrically conductive layer or the glass plate via the connection portion and the lead-free solder and caused cracking. On the other hand, with regard to the example, it can be considered that since the connection portion and the electrically conductive layer were not connected to each other via the lead-free solder, and the lead-free solder extended rearward from the rear end portion of the installation portion in a flared manner, cracking did not occur.

LIST OF REFERENCE NUMERALS

1: Glass plate
2: Defogger (electrically conductive layer)
3: Connection terminal
4: Lead-free solder
5: Cable
10: Glass plate module
31: Installation portion
32: Standing portion
33: Connection portion
34: Holding portion

The invention claimed is:
1. A glass plate module comprising:
a glass plate;
an electrically conductive layer laminated on the glass plate;
at least one connection terminal fixed to the electrically conductive layer and made of an electrically conductive material; and
lead-free solder for fixing the connection terminal to the electrically conductive layer,
wherein the connection terminal includes:
a single installation portion that is fixed to the electrically conductive layer via the lead-free solder;
a standing portion that extends from an end portion of the installation portion in a direction away from the glass plate; and
a connection portion that is coupled to an end portion of the standing portion on the opposite side to the installation portion and extends in a direction away from the installation portion along a surface direction of the glass plate,
the connection portion has a power supply portion to which a cable for supplying electric power to the electrically conductive layer is connected, the power supply portion being located at a position that is spaced apart from the installation portion in the surface direction of the glass plate,
wherein the lead-free solder extends horizontally on the electrically conductive layer surface beyond the standing portion and an upper end of the lead-free solder extends on the standing portion,
a length of the standing portion between a surface of the installation portion that faces the electrically conduc- tive layer and a surface of the connection portion that faces the electrically conductive layer is 2 mm or more, and the standing portion stands at an angle of 80 degrees or more to the installation portion.

2. The glass plate module according to claim 1, wherein the power supply portion includes a holding portion that holds the cable, the holding portion being located on a surface of the connection portion that faces the electrically conductive layer.

3. The glass plate module according to claim 2, wherein the holding portion is configured to hold the cable by being crimped onto the cable.

4. The glass plate module according to claim 1, wherein a thickness of the glass plate is from 2.2 mm to 5.1 mm.

5. The glass plate module according to claim 1, wherein the single installation portion is plate-shaped, and the standing portion stands at an angle of 80 degrees or more to the installation portion.

* * * * *